United States Patent [19]

Yonezawa et al.

[11] 4,224,636
[45] Sep. 23, 1980

[54] SEMICONDUCTOR DEVICE WITH THERMALLY COMPENSATING SIO₂-SILICATE GLASS-SIC PASSIVATION LAYER

[75] Inventors: Toshio Yonezawa, Yokosuka; Takashi Ajima, Tokyo; Masato Uchida, Yokohama, all of Japan

[73] Assignee: Tokyo Shibaura Electric Co., Ltd., Japan

[21] Appl. No.: 915,542

[22] Filed: Jun. 14, 1978

Related U.S. Application Data

[63] Continuation of Ser. No. 753,444, Dec. 22, 1976, abandoned.

[30] Foreign Application Priority Data

Dec. 24, 1975 [JP] Japan .................. 50-153379
Mar. 16, 1976 [JP] Japan .................. 51-27650
Mar. 16, 1976 [JP] Japan .................. 51-27651

[51] Int. Cl.² .................................. H01L 29/34
[52] U.S. Cl. ............................ 357/54; 357/16; 357/49; 357/52; 357/60; 357/71
[58] Field of Search ............ 357/16, 54, 52, 71, 357/49, 60; 427/85, 93, 95, 228, 249

[56] References Cited

U.S. PATENT DOCUMENTS

| | | | |
|---|---|---|---|
| 2,937,324 | 5/1960 | Kroko | 357/16 |
| 3,157,541 | 11/1964 | Heywang et al. | 357/16 |
| 3,400,309 | 9/1968 | Doo | 357/49 |
| 3,451,867 | 6/1969 | Taft et al. | 148/175 |
| 3,455,020 | 7/1969 | Dawson et al. | 357/54 |
| 3,465,209 | 9/1969 | Denning et al. | 357/54 |
| 3,469,155 | 9/1969 | Van Beek | 357/23 |
| 3,485,666 | 12/1969 | Sterling et al. | 117/230 |
| 3,497,773 | 2/1970 | Kisinko et al. | 357/49 |
| 3,527,626 | 9/1970 | Brander et al. | 148/33.4 |
| 3,550,256 | 12/1970 | Deal et al. | 29/571 |
| 3,812,519 | 5/1974 | Nakamura et al. | 357/60 |
| 3,967,310 | 6/1976 | Horiuchi et al. | 357/54 |

FOREIGN PATENT DOCUMENTS

| | | | |
|---|---|---|---|
| 1589900 | 8/1970 | Fed. Rep. of Germany | 357/54 |
| 47-33548 | 8/1972 | Japan | 357/54 |
| 48-2833 | 1/1973 | Japan | 357/54 |
| 1114798 | 5/1968 | United Kingdom | 357/49 |
| 1142405 | 2/1969 | United Kingdom | 357/54 |
| 1143864 | 2/1969 | United Kingdom | 357/54 |
| 1162565 | 8/1969 | United Kingdom | 357/49 |
| 1182152 | 4/1970 | United Kingdom | 357/54 |
| 1224801 | 3/1971 | United Kingdom | 357/49 |
| 1334520 | 7/1971 | United Kingdom | 357/91 |

OTHER PUBLICATIONS

A. Healy, "Integrated Semiconductor Devices", IBM Tech. Discl. Bull., vol. 8, #7, Dec. 1965, pp. 1016–1017.

Primary Examiner—Stanley D. Miller, Jr.
Attorney, Agent, or Firm—Finnegan, Henderson, Farabow, Garrett & Dunner

[57] ABSTRACT

A semiconductor device comprising a semiconductor substrate and protective films formed thereon. The protective films comprise at least one silicon carbide film which may be pure or may contain particular impurities.

8 Claims, 22 Drawing Figures

THIS INVENTION

----- PRIOR ART

○ THIS INVENTION

× PRIOR ART

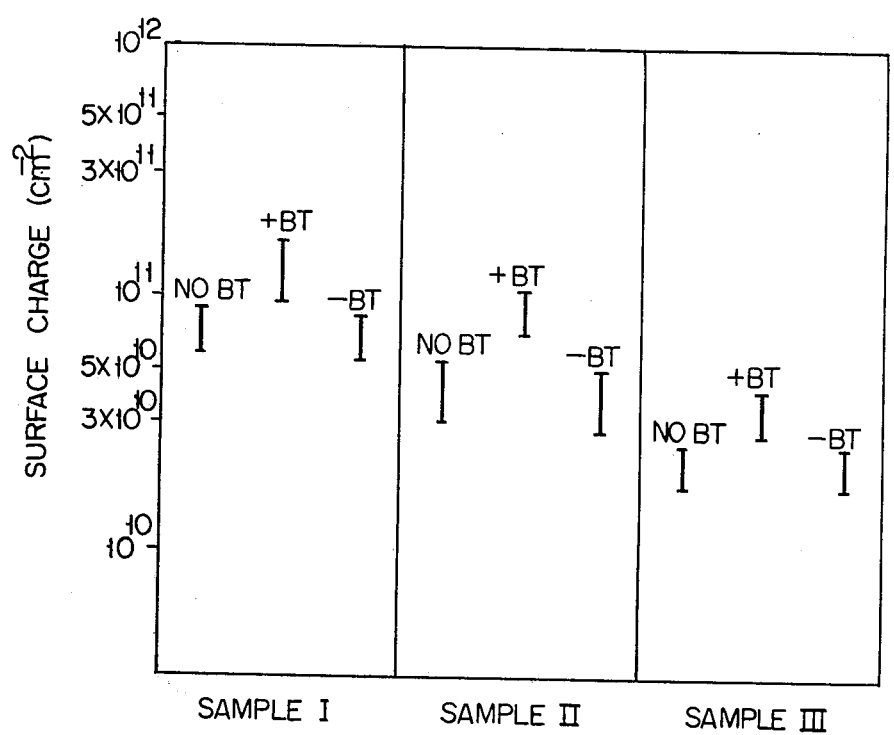
F I G. 20

SEMICONDUCTOR DEVICE WITH THERMALLY COMPENSATING SIO₂–SILICATE GLASS–SIC PASSIVATION LAYER

This is a continuation of application Ser. No. 753,444, filed Dec. 22, 1976 now abandoned.

This invention relates to a semiconductor device having a novel protective film, more particularly, to one having at least one silicon carbide film as the protective film.

A semiconductor device such as a transistor, a diode and an integrated circuit comprises a semiconductor substrate, an insulation film like a silicon dioxide film formed on the semiconductor substrate and a protective film or a passivation film made of alumina, PSG (Phospho-silicate glass), etc. which is formed on the insulation film. Hereinafter, SG refers to silicate glass.

Appended FIG. 1 shows an example of conventional semiconductor device. As shown in the drawing, a transistor 1 and a resistor 2 are formed in a semiconductor substrate 3. Further, A SiO₂ insulation film 4 and a PSG film 5 are laminated on the surface of the semiconductor substrate 3. Still further, metal electrodes 6, 6' and wiring (not shown) are formed through the steps of exposing the desired portions of the semiconductor substrate by photo-etching, or the like, depositing aluminum layer, and selectively etching the aluminum layer. In the example of FIG. 1, the wiring portion is also covered with a SiO₂ insulation layer 4' and a PSG protective film 5'.

The insulation film and protective film serve to protect the semiconductor substrate from contamination with impurities, thereby preventing channel occurrences in the base region or the collector region. Further, these films covering the electrodes and wiring portion prevent them from peeling off the substrate. However, a PSG film or the like used as a passivation film presents a remarkable problem. Namely, the film tends to absorb moisture during the use, resulting in phosphoric acid formation. The phosphoric acid thus formed etches the metal electrodes and the wiring portion, resulting in breakage thereof in extreme cases. Further, a film of glass like PSG exhibits polarization effect, leading to decreases in collector-emitter breakdown voltage ($V_{CEO}$) and in collector-base breakdown voltage ($V_{CBO}$) as well as to an increased noise variation.

A semiconductor device is produced through the steps of forming an insulation film, selectively etching the insulation film for impurity diffusion into the semiconductor substrate, forming another insulation film, selectively etching said film, etc. It follows that the product semiconductor device comprises insulation films subjected to heat treatments several times in its manufacturing stage. It should be noted in this connection that the insulation films thus formed are contaminated with alkali metal impurities like sodium ions which are generated in the heating steps, for example, from a tube for effecting uniform heating. Accordingly, an additional disadvantage is presented that the conventional semiconductor device is likely to give rise to channel occurrences in the base region or the collector region.

Methods for improving noise properties, etc. by the modified construction of the semiconductor substrate itself have been proposed in the U.S. Pat. Nos. 3,812,519; 3,834,953; 3,858,238; and 3,879,230, all granted to Yonezawa et al. These methods are collectively called Perfect Crystal Device Technology, hereinafter referred to as the "PCT method," and featured in that at least one kind of impurity other than arsenic is diffused into a semiconductor substrate to form a high impurity concentration region, followed by diffusing arsenic and at least one kind of impurity other than arsenic into the high impurity concentration region to form an arsenic diffusion region therein. The arsenic diffusion is intended to prevent the occurrence of lattice defects of the semiconductor crystal and the concentration thereof is set lower than that of the other impurity.

The PCT method is satisfactory to some extent. But, in order to meet the recent requirement for a semiconductor device with a much lower noise generation, it is of high concern in the art to develop a much improved passivation film and blocking material.

An object of this invention is to provide a semiconductor device comprising a novel protective film which does not absorb moisture and does not exhibit polarization effect.

Another object is to provide a semicondcutor device comprising a novel protective film exhibiting a satisfactory blocking effect against contamination with alkali metal impurities derived in the heating steps.

Still another object is to provide a semiconductor device with a high current amplification factor and low noise generation.

The above-mentioned and other objects and advantages of this invention will become apparent as the invention is more thoroughly discussed hereinafter.

SUMMARY OF THE INVENTION

The semiconductor device according to this invention comprises at least one silicon carbide film formed to cover the semiconductor substrate with an insulation film intervening between the substrate and the silicon carbide film. In order to enhance the passivation effect and promote the etching rate, the silicon carbide film may be doped with at least one impurity selected from the group of P, Al, Pb, B, Ti, Ga, Zn, Zr, Sr, Cr, Mo, W, Ni, Fe, Co and Ta. As a preferred embodiment of this invention, a protective film made of at least one of PSG, P.AsSG, P.BSG, P.SbSG, SiON, Si₃N₄, etc. as well as the oxides of the elements enumerated above may be formed together with the silicon carbide film. Further, a semiconductor device of satisfactory properties may be produced by providing a silicon carbide film on a semiconductor substrate prepared by the PCT method.

This invention can be more fully understood from the following detailed description when taken in conjunction with the accompanying drawings, in which:

FIG. 20 shows the surface charge of the semiconductor device for both this invention and the prior art;

Figure 1:
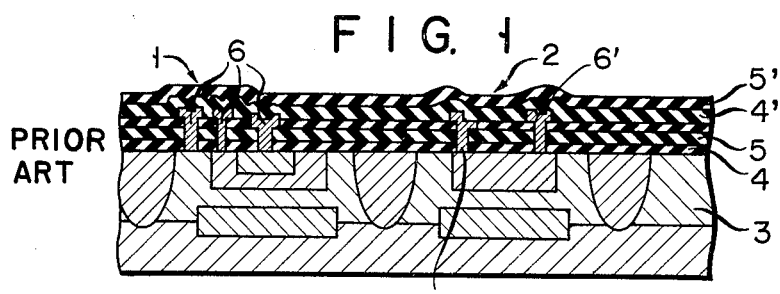
FIG. 1 is a cross sectional view of a conventional semiconductor device.
Figure 2:
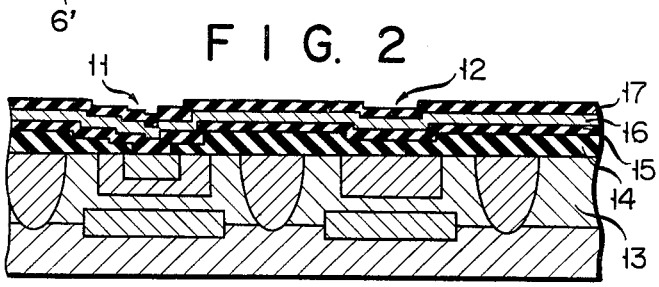
FIGS. 2 to 5 are cross sectional views showing collectively the steps of producing a semiconductor device according to one embodiment of this invention.

FIGS. 2 to 5 collectively show the steps of producing a semiconductor device according to one embodiment of this invention. FIG. 2 shows that a transistor 11 and a resistor 12 are formed in a semiconductor substrate 13. These elements are formed by the known steps of epitaxial crystal growth or chemical vapor deposition, formation of a SiO$_2$ film, selective photo-etching of the SiO$_2$ film and impurity diffusion. It is seen that the SiO$_2$ film 14 used as the mask in the impurity diffusion step remains as a so-called field insulation film on the surface of the semiconductor substrate 13. On the surface of the film 14 is laminated a PSG film 15, a SiC film 16 and a SiO$_2$ film 17 formed by evaporation, sputtering, chemical vapor deposition, etc.

The SiC film 16 is formed by the method of chemical vapor deposition utilizing silicon tetrahydride (SiH$_4$) and toluene (C$_7$H$_8$) as reactants, ordinary evaporation, sputtering, or the like.

Figure 3:
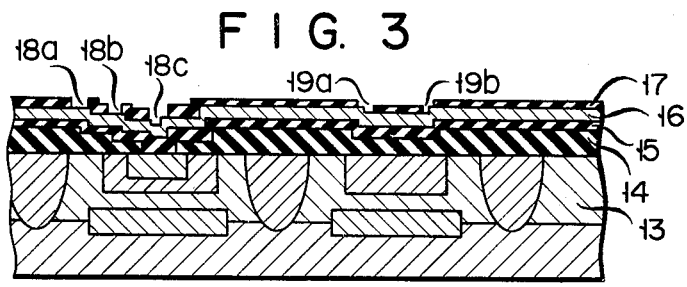

The SiO$_2$ film 17 is selectively removed by an ordinary method of photo-etching so as to provide openings 18a, 18b, 18c for mounting electrodes for the collector, base and emitter of the transistor 11, respectively, and openings 19a and 19b for mounting electrodes for the resistor 12 as shown in FIG. 3.

Figure 4:
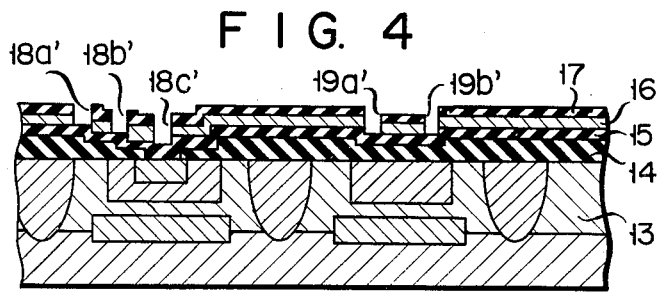
Figure 5:
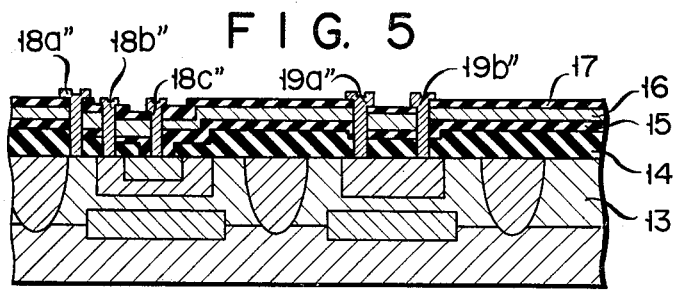

That portions of the SiC film 16 which have been exposed by the selective etching of the SiO$_2$ film 17 are removed by plasma etching or the like with CF$_4$, thereby providing openings 18a', 18b', 18c', 19a' and 19b' as shown in FIG. 4. Then, the PSG film 15 and the SiO$_2$ insulation film 14 are selectively removed by an ordinary etching method, followed by aluminum deposition and selective etching thereof for mounting electrodes 18a", 18b", 18c", 19a" and 19b" in electric contact with the semiconductor substrate 13 as shown in FIG. 5.

The SiO$_2$ films 14 and 17 are formed by chemical vapor deposition, etc. for the insulation purpose of the semiconductor device. If the silicon carbide film is formed in direct contact with the semiconductor substrate, the short circuit problem may take place among the base, collector and emitter of the transistor because silicon carbide is a semiconductor material. In other words, the SiO$_2$ film 14 serves to prevent the short circuit problem mentioned. On the other hand, the SiO$_2$ film 17 serves to prevent short circuit among the electrodes. Incidentally, the insulation film 17 may also be formed by heating the SiC film 16 under an oxidative atmosphere, i.e., by the oxidation of the SiC film 16.

The preferred thickness of the SiC film ranges from 50Å to 5μ, more desirably, from 500Å to 3000Å. Further, the film may contain at least one kind of impurity selected from the group of P, Al, Pb, B, Ti, Ga, Zn, Zr, Sr, Cr, Mo, W, Ni, Fe, Co and Ta. The preferred impurity concentration ranges from $10^{19}$ to $10^{22}$ atoms/cm$^3$, more desirably, from $10^{20}$ to $10^{21}$ atoms/cm$^3$. The SiC film doped with the impurity may be formed by various methods including, for example, ion implanation method, chemical vapor deposition method utilizing the reduction of gases such as arsine (AsH$_3$) and phosphine (PH$_3$), and a method of depositing a mixture of silicon carbide and the impurity by sputtering, electron beam deposition, plasma deposition, etc.

In some cases, the heat treatments are effected at temperatures lower than 1000° C. in order to control the diffusion layers for the purpose of controlling the current amplification factor, $V_{CEO}$ and $V_{CBO}$ of the transistor. Under the temperature condition mentioned, the silicon carbide film becomes amorphous. But, the film exhibits a sufficient effect as a passivation film of a semiconductor device even if it is amorphous.

Figure 8:
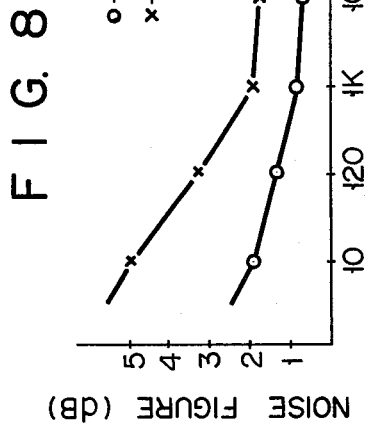
FIG. 8 is a graph showing the noise figure of the semiconductor device for both this invention and the prior art.
Figure 6:
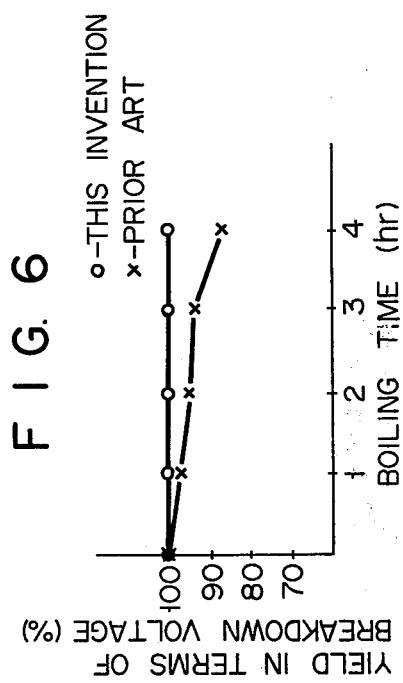
FIG. 6 is a graph showing the relationships between the yield of the semiconductor device in terms of breakdown voltage and the immersion time of the semiconductor device in boiling water, for the cases of both this invention and the prior art.
Figure 7:
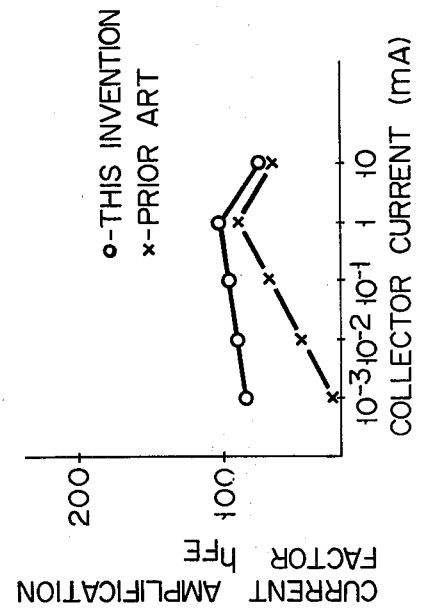
FIG. 7 is a graph showing the current amplification factor of the semiconductor device for both this invention and the prior art.

FIGS. 6, 7 and 8 show the comparative data between the semiconductor device according to this invention which comprises a silicon carbide passivation film and the conventional semiconductor device with respect to the yield in terms of the breakdown voltage, the current amplification factor h$_{FE}$ and the noise figure, respectively.

Referring to FIG. 6, the yield (%) in terms of breakdown voltage is plotted on the ordinate and the time (hour) during which the semiconductor device was immersed in boiling water on the abscissa. The circles (O) and the crosses (X) in the graph denote the semiconductor devices according to this invention and conventional semiconductor devices, respectively. The yield plotted is the percentage of the semiconductor device samples which exhibited less than 0.1μA of surface leak current when the V$_{CBO}$ was set at 100V relative to all the samples tested. FIG. 6 shows that the yield for the case of this invention is substantially 100% even 4 hours after the immersion in boiling water in contrast to less than 90% for the prior art case.

In FIG. 7, the current amplification factor h$_{FE}$, i.e., I$_C$/I$_B$, with the emitter connected to the ground is plotted on the ordinate and the collector current (mA) on the abscissa. It is shown that the semiconductor device according to this invention is markedly advantageous over the conventional device in current amplification factor particularly in small collector current regions. For example, the current amplification factor for the case of this invention was measured to be about 100 where the collector current was set at $10^{-3}$ mA. It is also important to note that the difference in current amplification factor between two transistors formed within one chip, i.e., pair property, was about 1%.

FIG. 8 shows the relationship between the noise figure (dB) and the frequency measured under the conditions: I$_C$=100μA; V$_{CE}$=3V; and Rg=1kΩ. It is shown that the noise figure of the semiconductor device according to this invention is less than half the value for the conventional semiconductor device. For example, the noise figure at 10 Hz for the invented semiconductor device was about 2 dB in contrast to about 5 dB for the conventional device.

The semiconductor devices according to this invention, the properties of which are shown in FIGS. 6, 7, 8, comprised both a PSG film and a SiC film. But, substantially the same results were obtained from experiments conducted on semiconductor devices comprising as the passivation film a SiC film alone, an impurity-doped SiC film alone, or an impurity-doped SiC film and a PSG film.

The silicon carbide film also exhibits a stress compensation effect between the semiconductor substrate and the insulation films laminated thereon. The thermal expansion coefficients of silicon, silicon dioxide and silicon carbide are:

Si ... $2.5 \times 10^{-6}$°C.$^{-1}$
$SiO_2$... $0.35 \times 10^{-6}$°C.$^{-1}$
SiC ... $4.5 \times 10^{-6}$°C.$^{-1}$ A semiconductor device having $SiO_2$ films laminated on a Si substrate is known to be deformed or broken during the heating steps because of the above-noted difference in thermal expansion coefficient between Si and $SiO_2$. However, the use of SiC film coated over the $SiO_2$ film serves to prevent such a deformation and breakage.

Figure 9:
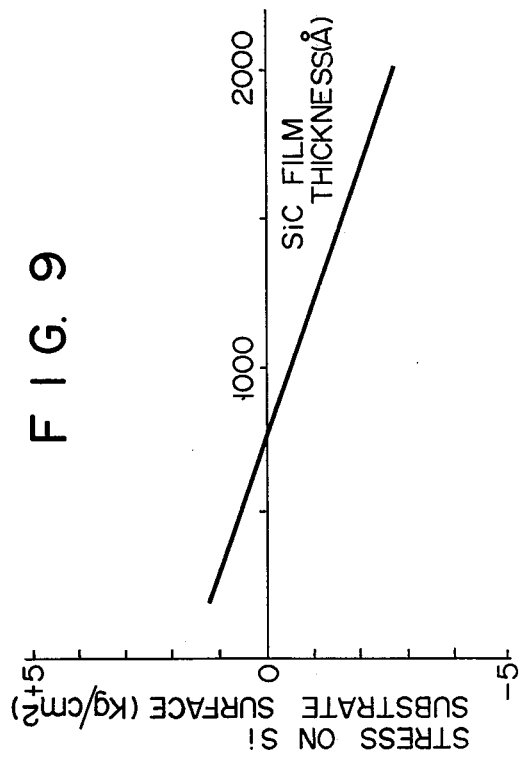
FIG. 9 is a graph showing the relationships between the SiC film thickness and the stress exerted on the surface of the Si substrate.

FIG. 9 shows the relationship between the SiC film thickness (Å) and the stress ($kg/cm^2$) exerted on the surface of the Si substrate. The positive region of the stress represents expansion of the substrate and the negative region denotes compression. As shown in FIG. 9, the stress exerted on the surface of the Si substrate is zero when the SiC film is about 750Å thick. In other words, the SiC film of the thickness mentioned exhibits the maximum stress compensation effect.

A semiconductor device comprising a semiconductor substrate prepared by PCT method and a silicon carbide passivation film also exhibits excellent properties and is included in the scope of this invention. FIGS. 10 to 19 collectively show, as an example, the steps of producing a discrete semiconductor device according to another embodiment of this invention.

Figure 10:
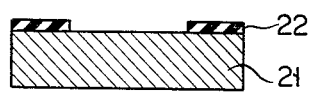
FIGS. 10 to 19 are cross sectional views showing collectively the steps of producing a semiconductor device according to another embodiment of this invention.
Figure 12:
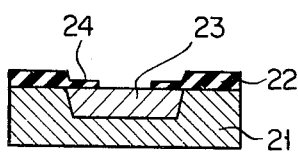
Figure 13:
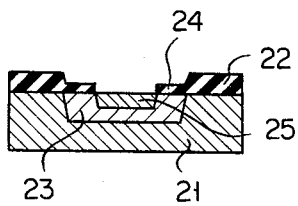

As shown in FIG. 10, a $SiO_2$ film 22 is selectively formed on the surface of an N$^-$type silicon substrate 21. At least one kind of P-type impurity other than As is diffused into the substrate 21 to form a high impurity concentration region 23 (FIG. 11) constituting a base region. Then, another $SiO_2$ film 24 is formed on the entire surface by chemical vapor deposition, etc., followed by selective removal of the $SiO_2$ film to expose a part of the high impurity concentration region 23 (FIG. 12). An emitter region 25 is formed by diffusing As and another impurity like P into the exposed high impurity region (FIG. 13).

Instead of diffusion, the emitter region may be formed by utilizing chemical vapor deposition. Specifically, $SiO_2$ containing P and As is deposited by chemical vapor deposition from a mixed gas having predetermined ratios of $PH_3$ and $AsH_3$ blended into a mixture of $SiH_4$ and $O_2$, followed by heating the deposited film at about 1100° C. for 4 hours. In order to minimize the lattice defect of the crystal of the emitter region 25, the number of As atoms should desirably be about 3 to 24% based on the number of P atoms. It has been found that the crystal of emitter region is free from dislocation and segregation if the impurity concentration is $4.0 \times 10^{20}$ atoms/$cm^3$ or less. It has also been found that the expansion of the base region width owing to the emitter dip effect is as negligibly small as less than 0.2% based on the original width of the base region.

Figure 14:
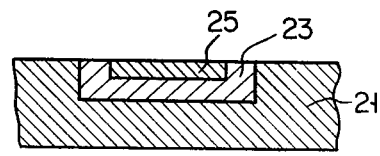
Figure 11:
Figure 15:
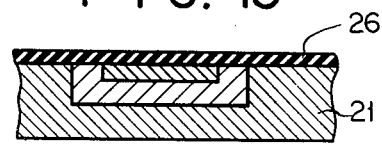

All the laminate formed on the silicon substrate 21 is then removed as shown in FIG. 14 and a fresh $SiO_2$ film 26 is formed on the exposed surface of the silicon substrate by oxidation thereof carried out under an atmosphere of $H_2$, $O_2$ and HCl as shown in FIG. 15. This oxidation treatment is effected at about 1000° C. for 30 minutes, thereby forming a $SiO_2$ film 1500Å thick and extremely low in pin hole occurrence. It is important to note that the $SiO_2$ films 22 and 24 used for forming the base region 23 and the emitter region 25 have been removed before forming the $SiO_2$ film 26. The $SiO_2$ films 22 and 24 are subjected to heat treatments several times, resulting in contamination with alkali metal impurities such as sodium ion. Accordingly, the removal of the $SiO_2$ films is very effective for enabling the resultant semiconductor device to be capable of preventing channel occurrences and lowering the noise generation.

Figure 16:
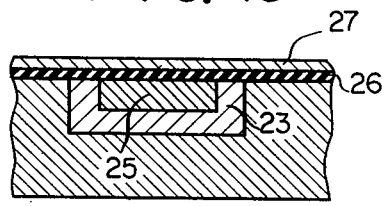
Figure 17:
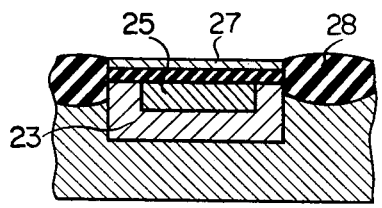

A SiC film 27 about 2000Å thick is then formed on the insulation film 26 by chemical vapor deposition, sputtering, etc. as shown in FIG. 16. The SiC film 27 thus formed is selectively removed to expose that portion of the insulation film 26 which lies outside of the base region 23 and the emitter region 25. The semiconductor substrate is further heated at 1100° C. for 3 hours under the mixed gas atmosphere of $H_2$, $O_2$ and HCl, thereby enabling the exposed $SiO_2$ insulation film to grow into a thickness of about 5000 to 6000A, namely, an insulation film 28 is formed by this heat treatment as shown in FIG. 17. In this heat treatment, the remaining SiC film 27 acts as a mask and, thus, the $SiO_2$ insulation film below the SiC film is not allowed to grow into the base and emitter regions. It follows that the insulation film 28 is much thicker than the film 26. This construction is effective for preventing a channel occurrence which is caused by decreased hole concentration on the surface area of the base region and for preventing the inversion of the collector region which is caused by the power source voltage. Incidentally, the channel occurrence and the collector region inversion mentioned above originate from the transistor construction in that the impurity concentration of the collector region is much lower than that of the base region and the emitter region. An additional merit resulting from the formation of the $SiO_2$ insulation film 28 is that, if a resistor is also formed, the resistance of the resistor is kept substantially unvaried.

Figure 18:
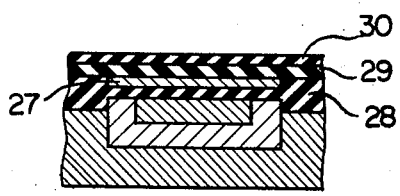

A pure $SiO_2$ film 29 about 2000 to 4000Å thick and an additional $SiO_2$ film 30 doped with P and As and about 2000 to 3000Å thick are further formed by chemical vapor deposition as shown in FIG. 18. An annealing step follows the formation of these insulation films. Namely, the annealing is effected at about 1000° C. for 10 minutes in an oxidative or inactive atmosphere, followed by treatment with $POCl_3$ for removing harmful impurities.

Figure 19:
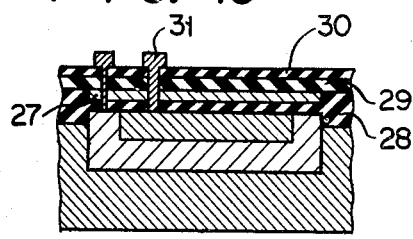

Finally, metal electrodes 31 are formed by an ordinary method as shown in FIG. 19. As described repeatedly, the SiC film 27 acts as a passivation film in the resultant semiconductor device.

Comparative tests were conducted on the following three samples in order to look into the advantage of the semiconductor device according to this invention over the conventional devices in surface charge per unit area ($N_{FB}$):

EXAMPLE I

Semiconductor device comprising a Si substrate having predetermined semiconductor regions formed therein by PCT method mentioned above and a clean $SiO_2$ film formed on the Si substrate (conventional device).

EXAMPLE II

Semiconductor device prepared by forming a $Si_3N_4$ film on the $SiO_2$ film of sample I (conventional device).

EXAMPLE III

Semiconductor device prepared by forming a SiC film on the SiO$_2$ film of Example I (device according to this invention).

Specifically, a reversed bias was applied first to each of these samples so as to measure the expansion of depletion layer. Then, each of these samples was subjected to bias temperature treatment, namely, the sample was kept at 300° C. for 10 minutes and electric field of $10^6$ V/cm was applied thereto during the heating time as forward and reversed biases respectively. After the bias temperature treatment, the amount of movable ions was semi-quantitatively measured.

Surface charge per unit area ($N_{FB}$) provides a good criterion for overall evaluation of mobile charge, surface state density, etc. and permits overall evaluation of passivation effect and blocking effect of the silicon carbide film, a PSG film, etc. of the semiconductor device. FIG. 20 shows the results of the comparative tests. In the drawing, "NO BT" represents that bias temperature treatment was not applied to the sample. On the other hand "+BT" and "−BT" respectively denote that the forward and reversed biases were applied to the samples during the bias temperature treatments. FIG. 20 demonstrates that the semiconductor device according to this invention which comprises a SiC film (Example III) is remarkably superior to the conventional semiconductor devices.

Figure 21:
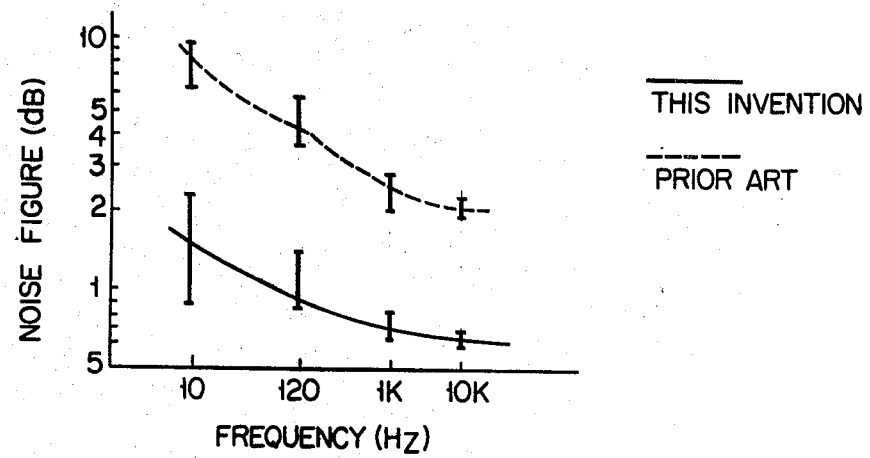
FIG. 21 shows the noise figure of the semiconductor device for both this invention and the prior art.
Figure 22:
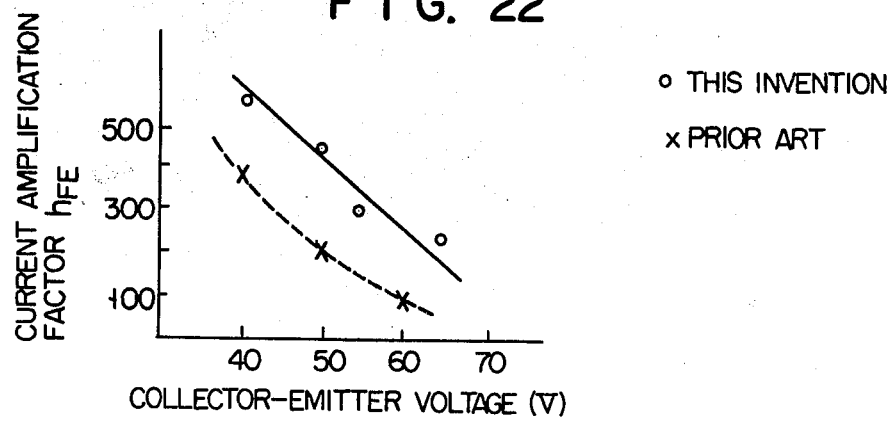
FIG. 22 is a graph showing the relationships between the current amplification factor and the collector-emitter breakdown voltage for the semiconductor devices of both this invention and the prior art.

The semiconductor device according to this invention (Example III) was also subjected to measurements of noise figure and current amplification factor (h$_{FE}$), with the results as shown in FIGS. 21 and 22, respectively, in comparison with the conventional semiconductor device (Example I). The noise figure was measured under the conditions: $I_C=100\mu A$, $V_{CE}=3V$, and $Rg=1k\Omega$. As shown in FIG. 21, the noise figure of the semiconductor device according to this invention was less than half the value of the conventional semiconductor device. FIG. 22 also shows a marked advantage of this invention over the prior art. It is shown that the $V_{CEO}$ of the invented device is far higher than that of the conventional device when the comparison is made at the same current amplification factor. This indicates that the semiconductor device according to this invention permits a generation-recombination current to be much lower than that of the conventional semiconductor device. Incidentally, the yield in terms of breakdown voltage as defined previously was also measured for these two kinds of semiconductor device, with the results substantially equal to those shown in FIG. 6.

What we claim is:

1. An improved semiconductor device of the type including a semiconductor substrate with an outward-facing surface having a plurality of P-N junctions disposed thereon, and an electrically insulating film covering each of the junctions, the insulating film including a layer of silicon dioxide formed directly on the substrate surface, the silicon dioxide having a characteristic coefficient of thermal expansion differing from that of the substrate, the improvement comprising film means selected for accommodating thermal stresses produced in the insulating film during significant temperature changes and for protecting the substrate and the insulating film from externally-incident contamination, said film means being formed on and substantially covering the insulating film and the substrate surface, said film means including a silicon carbide film and a silicate glass film selected from the group consisting of P-SG, P.As-SG, P.B-SG and P.Sb-SG, where SG means "silicate glass," said silicate glass film being formed between said silicon carbide film and the insulating film, and wherein said silicate glass film and said silicon carbide film cover substantially all the surface.

2. A semiconductor device according to claim 1, wherein the silicon carbide film contains at least one impurity selected from the group consisting of P, Al, Pb, B, Ti, Ga, Zn, Zr, Sr, Cr, Mo, W, Ni, Fe, Co and Ta.

3. A semiconductor device according to claim 1, wherein the thickness of the silicon carbide film ranges from 50Å to 5μ.

4. A semiconductor device according to claim 2, wherein the concentration of the impurity contained in the silicon carbide film ranges from $10^{19}$ to $10^{22}$ atoms/cm$^3$.

5. A semiconductor device according to claim 1, wherein the silicon carbide film is formed of aporphous silicon carbide.

6. A semiconductor device according to claim 1, wherein the semiconductor substrate comprises a high impurity concentration region formed by diffusing at least one kind of impurity other than arsenic and another impurity region formed within said high impurity concentration region by diffusing arsenic and at least one kind of impurity other than arsenic, the arsenic concentration being lower than the concentration of the other impurity.

7. A semiconductor device according to claim 6, wherein the number of the diffused arsenic atoms is 3% to 24% based on the number of atoms of the other impurity diffused together with arsenic.

8. The improved semiconductor device as in claim 1 wherein the thickness of said silicon carbide film is abut 750 Å.

* * * * *